United States Patent [19]

Matuzaki

[11] Patent Number: 5,270,541
[45] Date of Patent: Dec. 14, 1993

[54] MULTIPLE PHOTOELECTRIC SWITCH APPARATUS

[75] Inventor: Kiyokane Matuzaki, Kyoto, Japan
[73] Assignee: Omron Corporation, Kyoto, Japan
[21] Appl. No.: 917,005
[22] PCT Filed: Apr. 17, 1991
[86] PCT No.: PCT/JP91/00503
 § 371 Date: Aug. 6, 1992
 § 102(e) Date: Aug. 6, 1992
[87] PCT Pub. No.: WO91/16721
 PCT Pub. Date: Oct. 31, 1991

[30] Foreign Application Priority Data
Apr. 18, 1990 [JP] Japan ................. 2-41661[U]

[51] Int. Cl.$^5$ .............................................. H01J 5/02
[52] U.S. Cl. ................................ 250/239; 250/227.11
[58] Field of Search ............ 250/215, 216, 239, 227.11

[56] References Cited
U.S. PATENT DOCUMENTS
4,993,803 2/1991 Suverison et al. ............. 250/227.11
5,202,683 4/1993 Hamer et al. .

Primary Examiner—David C. Nelms
Attorney, Agent, or Firm—Dickstein, Shapiro & Morin

[57] ABSTRACT

A multiple photoelectric switch apparatus includes an apparatus body 10, a photoelectric switch unit 30 of an amplifier separation type, and a photoelectric switch unit 50 of an optical fiber type. The apparatus body 10 includes a plurality of mounting sections. Any one of the photoelectric switch units 30 and 50 of these types can be mounted on the mounting section 11. When these units 30 and 50 are mounted, main circuits 20 in the apparatus body 10 are connected via connectors 12, 32, and 52 to the units 30 and 50. Light projection signals are supplied from the main circuits 20 to light projecting and receiving circuits 45 and 64 of the respective units 30 and 50. Light reception signals from these light projecting and receiving circuits 45 and 64 are inputted to the main circuits 20 such that switch signals are outputted from the main circuits 20. The switch signals are transmitted from a transmitting circuit 21 to an external device. In this manner, with a unit of the apparatus body 10, the photoelectric switches of both of the amplifier separation type and the optical fiber type can be used at the same time.

5 Claims, 5 Drawing Sheets

MULTIPLE PHOTOELECTRIC SWITCH APPARATUS

DESCRIPTION

1. Technical Field

The present invention relates to a multiple photoelectric switch apparatus including a plurality of photoelectric switches disposed therein in the form of a block.

2. Background Art

In a case where many photoelectric switches are necessitated, a multiple photoelectric switch apparatus including many photoelectric switches in the form of a block is utilized. The multiple photoelectric switch apparatus includes an apparatus body and a plurality of sensing sections connected to the body. The sensing sections are respectively disposed at locations where objects are to be sensed. The apparatus body is disposed at an appropriate position where the body does not hinder the operation.

There exist two kinds of multiple photoelectric switch apparatuses.

The first kind is called an amplifier separation type, and a light projecting and receiving circuit is disposed in the sensing section. The sensing section is electrically connected to the apparatus body by a lead wire. The light projecting and receiving circuit in the sensing section includes light projecting and receiving elements and an amplifier. In the apparatus body, there is disposed a photoelectric switch main circuit which generates a light projection signal to be supplied to the light projecting element in the sensing section and a switch signal based on a reception signal outputted from the light receiving element.

The second kind is called an optical fiber type, and all of the light projecting and receiving elements, the amplifier, and the main circuit are disposed in the apparatus body. Two optical fibers are drawn from the body to an external space and end portions thereof constitute a sensing section. A light illuminated from the light projecting element of the body is emitted via one of the optical fibers from the end portion thereof. A light incident to the end portion of the other one of the optical fibers is received via the optical fiber by the light receiving element.

In the multiple photoelectric switch apparatus of the amplifier separation type, the light projecting and receiving elements can be located in the proximity of an object to be sensed, which hence leads to an advantage of a high sensing precision. In contrast thereto, in the multiple photoelectric switch apparatus of the optical fiber type, since the optical signal is transmitted by use of the optical fibers, there is attained an advantage of strength against electric noises. Conventionally, depending on utilization states and environments, either one of the amplifier separation type and the optical fiber type has been selectively used.

However, there exists a case where both of the amplifier separation type and the optical fiber type are desired to be used. In such a case, there has conventionally been a problem that two multiple photoelectric switch apparatuses respectively of the amplifier separation type and the optical fiber type are required to be prepared.

It is an object of the present invention to enable an apparatus body to use both of the amplifier separation type and the optical fiber type.

DISCLOSURE OF THE INVENTION

A multiple photoelectric switch apparatus in accordance with the present invention comprises an apparatus body, a photoelectric switch unit of a first type, and a photoelectric switch unit of a second type.

Said apparatus body includes a plurality of unit mounting sections in which said photoelectric switch units of the two types can be selectively and detachably mounted, a body-side connector disposed in each of said unit mounting section, and a plurality of signal processing circuits which are respectively connected to the connectors and which are commonly applicable to said photoelectric switch units of the two types.

Said photoelectric switch unit of the first type includes a first sensing head and a first connecting section connected thereto by a lead wire. Said first sensing head includes a light projecting and receiving circuit having a light projecting element and a light receiving element. Said first connecting section can be detachably mounted on said unit mounting section and includes a unit-side first connector which can be coupled with said body-side connector to connect said light projecting and receiving circuit of said first sensing head to said signal processing circuit.

Said photoelectric switch unit of the second type includes a second sensing head and a second connecting section connected thereto by optical fibers. Said second sensing head includes end portions of said optical fibers. Said second connecting section can be detachably mounted on said unit mounting section and includes a light projecting and receiving circuit which has a light projecting element and a light receiving element optically coupled to another end portions of said optical fibers and a unit-side second connector which can be coupled with said body-side connector to connect said light projecting and receiving circuit to said signal processing circuit.

Favorably, said apparatus body includes a transmitting circuit for transmitting switch signals outputted from said plural signal processing circuits.

For another apparatus body not having said transmitting circuit, in accordance with a mode for carrying out the present invention, said apparatus body includes a connector for leading a switch signal from said another apparatus body to said transmitting circuit.

In accordance with another mode for carrying out the present invention, said apparatus body includes means for fixing said photoelectric switch unit mounted on said apparatus body.

Moreover, the present invention provides an apparatus body for a multiple photoelectric switch apparatus. To said apparatus body, a first photoelectric switch unit comprising a first sensing head including a light projecting and receiving circuit having a light projecting element and a light receiving element and a first connecting section being connected to said first sensing head by a lead wire and including a unit-side first connector, and a second photoelectric switch unit comprising a second sensing head including end portions of optical fibers and a second connecting section being connected to said second sensing head by said optical fibers and including a light projecting and receiving circuit having a light projecting element and a light receiving element which are optically coupled with another ends of said optical fibers and a unit-side second connector are applicable.

The apparatus body comprises a plurality of unit mounting sections in which said first and second photoelectric switch units are selectively and detachably mounted, a body-side connector which is disposed in each said unit mounting section and which is capable of being coupled with said unit-side first or second connector of said first or second photoelectric switch unit mounted on said each unit mounting section, and a plurality of signal processing circuits which are respectively connected to said body-side connectors and which are commonly applicable to said light projecting and receiving circuits of said first and second switch units.

Favorably, said apparatus body includes a transmitting circuit for transmitting switch signals outputted from said plural signal processing circuits.

According to the present invention, when the photoelectric switch unit of the first type is mounted in the apparatus body, there is implemented a multiple photoelectric switch apparatus of the amplifier separation type.

Moreover, when the photoelectric switch unit of the second type is mounted in the apparatus body, there is attained a multiple photoelectric switch apparatus of the optical fiber type.

Furthermore, the apparatus body can be used such that the photoelectric switch unit of the first type is mounted on one or several mounting sections and the photoelectric switch unit of the second type is mounted on the other mounting sections. In this case, by preparing only one unit of the apparatus body, both of the amplifier separation type and the optical fiber type can be utilized. As above, depending on the states and environments, it is possible to adopt desired types of photoelectric switch units.

BRIEF DESCRIPTION OF THE DRAWINGS

The drawings show an embodiment according to this invention.

BEST MODE FOR CARRYING OUT THE INVENTION

Figure 1:
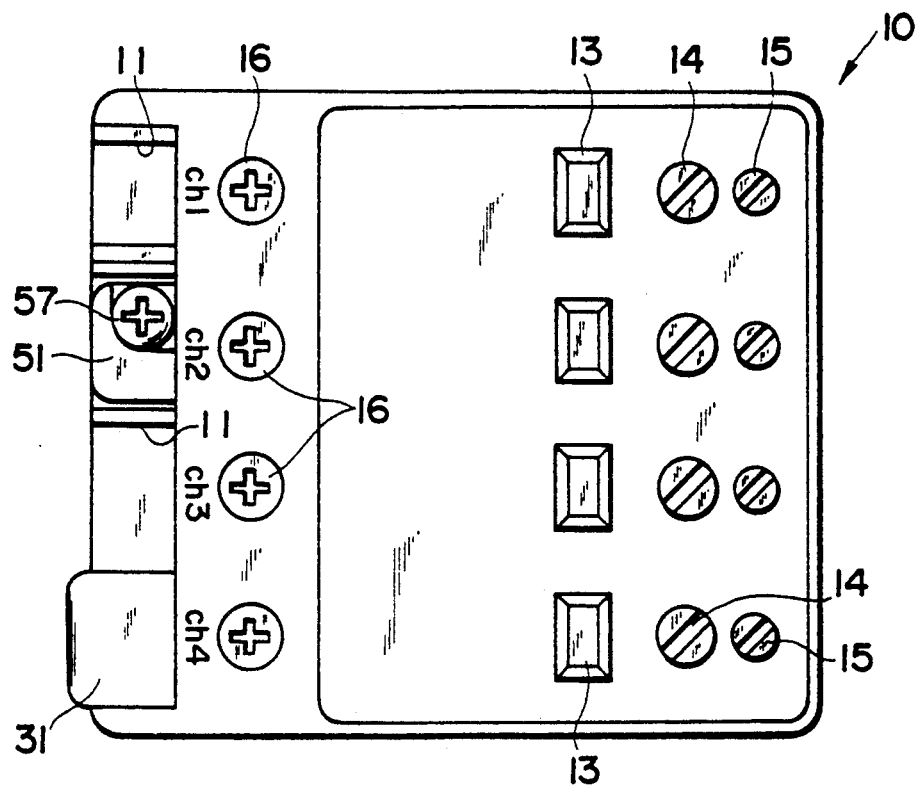
FIG. 1 is a plan view of the apparatus body of the multiple photoelectric switch apparatus.
Figure 2:
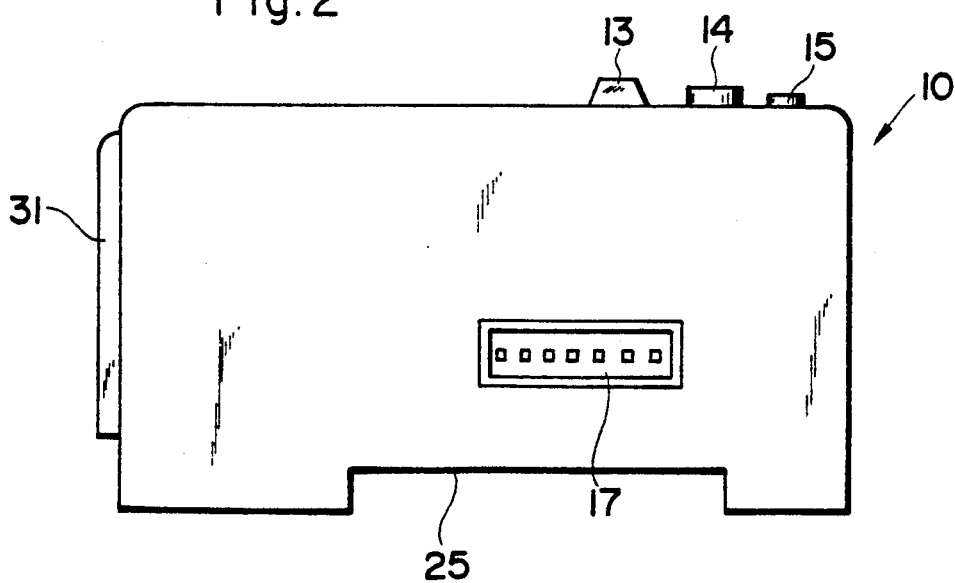
FIG. 2 is a side view of the apparatus body.
Figure 3:
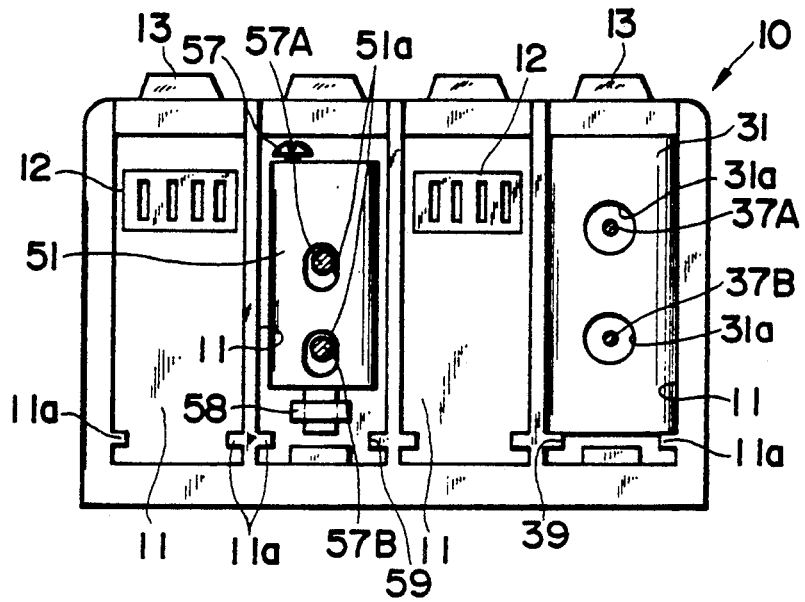
FIG. 3 is a front view of the apparatus body.
Figure 4:
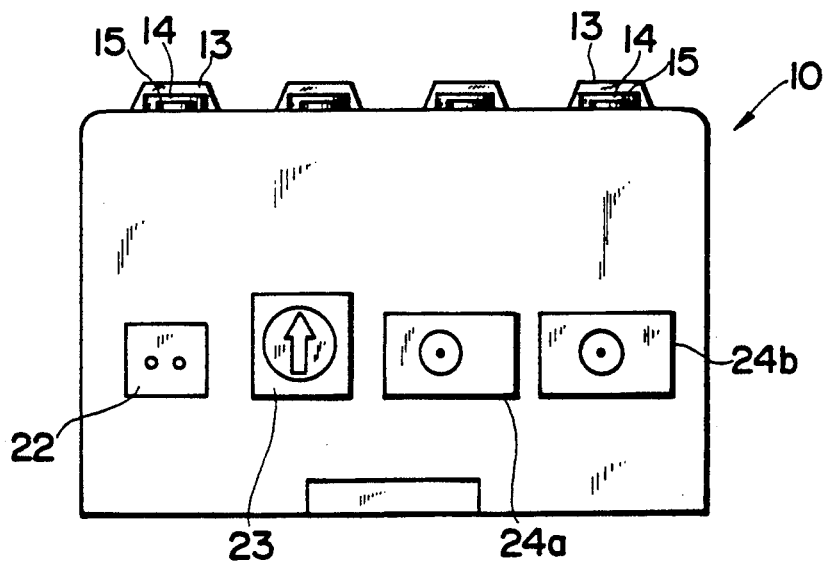
FIG. 4 is a rear view of the apparatus body.

Referring next to the drawings, description will be given in detail of an embodiment of the invention.

In this embodiment, the apparatus body of the multiple photoelectric switch apparatus has four channels. That is, four photoelectric switch units can be connected to the apparatus body. In response to a sense signal from each of these photoelectric switch units, the apparatus body generates a switch signal (a signal indicating presence or absence of an object to be sensed) and then transmits the signal to a control device or an upper-level control unit.

FIGS. 1 to 4 show the apparatus body 10.

Referring to these diagrams, four unit mounting sections 11 are formed in a front surface of the apparatus body 10. The unit mounting sections 11 are recessed portions and are separated from each other by separation walls. On a wall at a deep end of each of the unit mounting sections 11, there is disposed a body-side connector 12. The body-side connector 12 has four receiving sections. In the diagrams, a connecting section 31 of a photoelectric switch unit 30 of the first type is attached onto the mounting section 11 of the channel 4 (ch4), whereas a connecting section 51 of a photoelectric switch unit 50 of the second type is attached onto the mounting section 11 of the channel 2 (ch). In a lower portion of the separation wall forming a side surface of the unit mounting section 11, a flange 11a extending in the horizontal direction is formed so that the connecting section of each of the photoelectric switch unit is appropriately mounted thereon.

On an upper surface of the apparatus body 10, in association with each of the four channels, there are disposed an operation indication lamp 13, a sensitivity adjusting volume 14, and an on/off change-over switch 15. The operation indication lamp 13 is in general turned on when a detection object is sensed; however, conversely, the lamp may be turned on when the object is not sensed. The sensitivity adjusting volume 14 adjusts, as can be appreciated from its name, the sensitivity of the object sensing operation. The on/off change-over switch 15 is to set a state of a switch signal outputted when an object is sensed. For example, when the switch is set to on, a sensing of an object is represented by an H level of the switch signal, whereas, when the switch is set to off, a sensing of an object is represented by an L level of the switch signal.

On the front surface side of the upper surface of the apparatus body 10, there is disposed a fixing screw 16 for each channel. When the fixing screw 16 is engaged with a female screw (indicated by a reference numeral 56 for the connecting section 51 in FIG. 6) formed in the upper surface of the connecting section 31 or 51 of the photoelectric switch unit mounted onto the mounting section 11, the fixing state of the connecting section 31 or 51 is enhanced. This resultantly improves strength against vibrations.

On a side surface of the apparatus body 10, there is disposed a connector 17.

The apparatus body 10 includes or does not include therein a transmission circuit, which will be described later. The apparatus body 10 of this embodiment includes a transmission circuit 21 (FIG. 7), which can transmit switch signals of eight channels. The connector 17 supplies switch signals of four channels from an apparatus body not containing a transmission circuit to the transmission circuit 21.

On the rear surface of the apparatus body 10, there are disposed a direct-current (DC) power source connector 22 for supplying the apparatus body 10 with a DC operation power from an external power supply (for example, an alternate-current (AC) adapter), an address specifying rotary switch 23, and optical connectors 24a and 24b. The apparatus body 10 communicates optical signals with a control device or an upper-level control unit. The optical connector 24a is used to connect an optical fiber to the apparatus for this purpose. In addition, the apparatus body 10 communicates optical signals with another apparatus body. The optical connector 24b is adopted to connect an optical fiber to the apparatus for this purpose. The address specifying rotary switch 23 is disposed to set an identification number (or address) of the apparatus body 10 necessary for such communications.

In a bottom surface of the apparatus body 10, there is formed a positioning groove 25 for fixedly attaching the apparatus body 10 onto a din rail.

Figure 5:
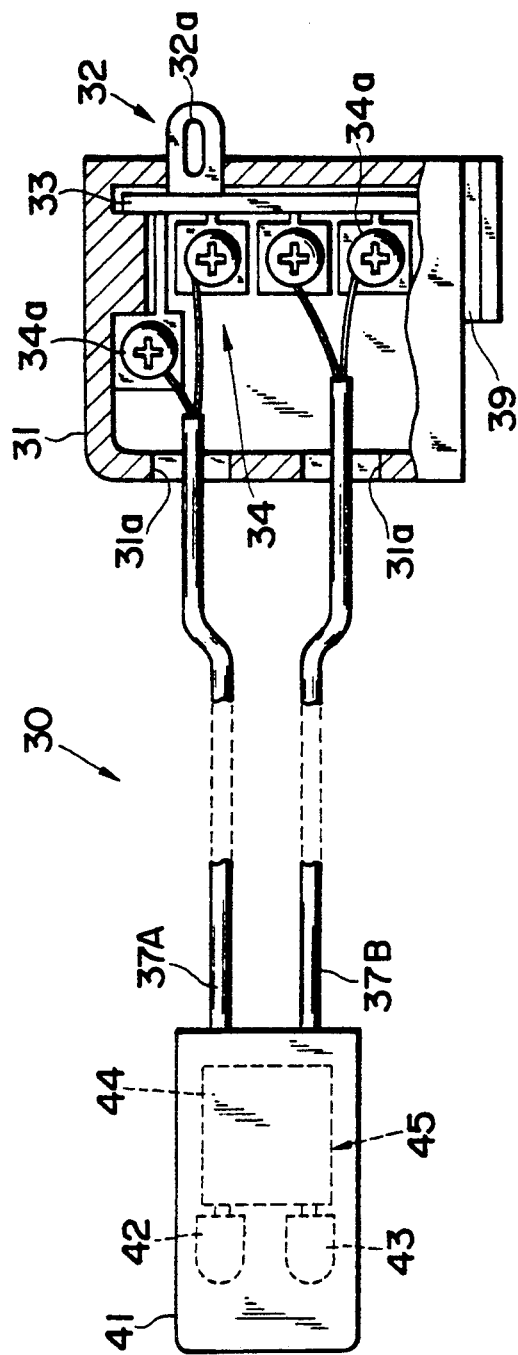
FIG. 5 is a partial cutaway side view showing the photoelectric switch unit of the first type.

Referring to FIG. 5, description will be given of the structure of the photoelectric switch unit 30 of the first type. The photoelectric switch unit 30 is of the amplifier separation type.

The photoelectric switch unit 30 includes a connecting section 31 and a sensing section 41 such that these sections 31 and 41 are connected to each other via two pairs of lead wires 37A and 37B. One of the two pairs, namely, the wire pair 37A is used for a light projection signal, whereas the other one thereof, namely, the wire pair 37B is used for a light receiving signal.

The connecting section 31 includes a unit-side connector 32, a circuit board 33, and a terminal plate 34.

The unit-side connector 32 includes four connector pins 32a. When the connecting section 31 is mounted onto the mounting section 11 of the apparatus body 10, this connector 32 is coupled with the body-side connector 12.

The terminal plate 34 includes four screw-type terminals 34a. These terminals 34a are connected to end portions of the four lead wires 37A and 37A in a respective manner. In the circuit board 33, there is formed a conductor pattern for linking the terminals 34a with the connector pins 32a associated therewith. The four lead wires 37A and 37B are electrically connected via the terminals 34a and the conductor pattern of the circuit board 33 to the associated connector pins 32a, respectively.

On both sides of the lower portion of the connecting section 31, there is formed a groove 39 to be slidably engaged with the flanges 11a formed in the mounting section 11 of the apparatus body 10.

Moreover, in the front surface of the connecting section 31, there are formed holes 31a for passing therethrough the lead wire pairs 37A and 37B.

The sensing section 41 includes a light projecting and receiving circuit 45. The light projecting and receiving circuit 45 includes a light emitting diode 42 as a light projecting element, a phototransistor 43 as a light receiving element, and a circuit board 44. On the circuit board 44, there is disposed an amplifier for amplifying a light reception signal from the phototransistor 43. The lead wire pair 37A for the light projection signal is connected via the circuit board 44 to the light emitting diode 42, whereas the lead wire pair 37B for the light reception signal is connected via the amplifier and the circuit board 44 to the phototransistor 43.

The light projecting and receiving elements are not limited to the light emitting diode and the phototransistor, namely, it is natural that a laser diode, a photodiode, and the like can be used.

Figure 6:
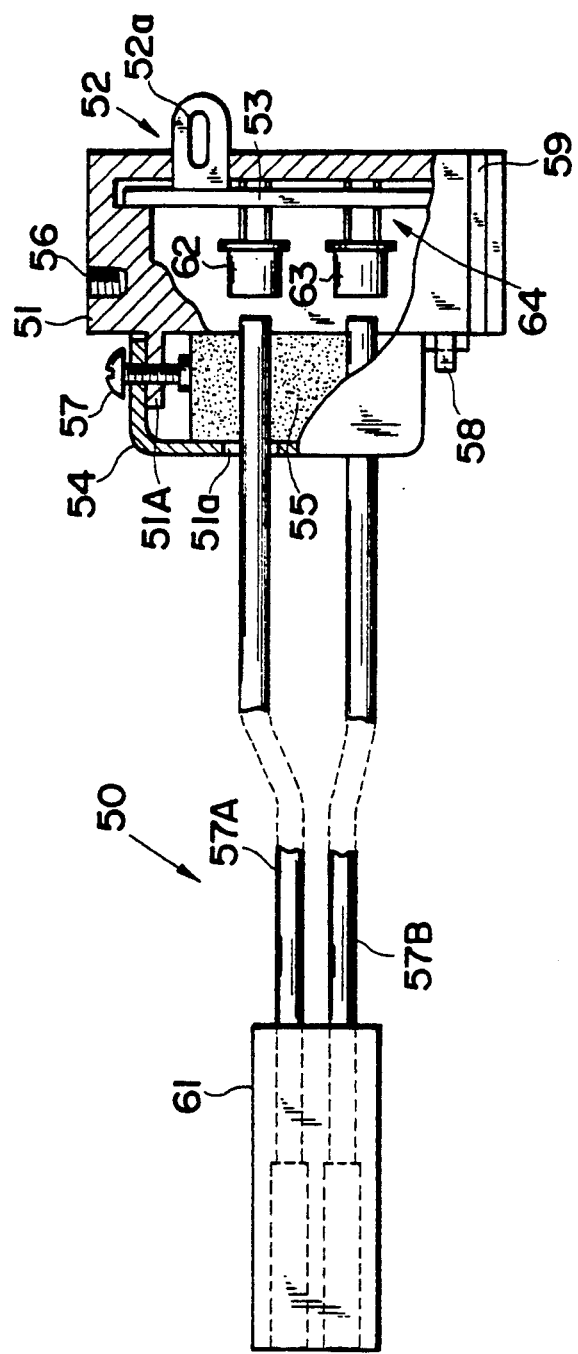
FIG. 6 is a partial cutaway side view showing the photoelectric switch unit of the second type.

Referring to FIG. 6, description will be given of the photoelectric switch unit 50 of the second type. The photoelectric switch unit 50 is of the optical fiber type.

The photoelectric switch unit 50 includes a connecting section 51 and a sensing section 61 such that these sections are optically coupled with each other by two optical fibers 57A and 57B. One of the fibers, namely, the optical fiber 57A is used to project a light, whereas the other one thereof, namely, the fiber 57B is adopted to receive a light.

In the connecting section 51, there are disposed a unit-side connector 52 and a light projecting and receiving circuit 64.

The unit-side connector 52 also includes four connector pins 52a. When the connecting section 51 is mounted onto the mounting section 11 of the apparatus body 10, the connector 52 is coupled with the body-side connector 12.

The light projecting and receiving circuit 64 includes a light emitting diode 62 as a light projecting element, a phototransistor 63 as a light receiving element, and a circuit board 53. On the circuit board 53, there is disposed an amplifier for amplifying a reception signal from the phototransistor 63. The connector pins 52a of the connector 52 are connected to a conductor pattern on the circuit board 53. The light emitting diode 62 is driven by a light projection signal supplied from the photoelectric switch main circuit 20 (FIG. 7) of the apparatus body 10 via the connectors 12 and 52 and the conductor pattern of the circuit board 53. The light reception signal from the phototransistor 63 is amplified by the amplifier and is then supplied via the conductor pattern of the circuit board 53 and the connectors 52 and 12 to the photoelectric switch main circuit 20.

On a front surface of the connecting section 51, there is disposed a cover 54. In the cover 54, there are formed holes 51a to pass respectively therethrough the optical fibers 57a and 57B. Moreover, an elastic body 55 is contained in the cover 54, and insertion holes are formed also in the elastic body 55. End portions of the optical fibers 57A and 57B are passed respectively through these holes 51a and the insertion holes of the elastic body 55 to oppose to a light emitting diode 62 and a phototransistor 63.

A lower end portion of the cover 54 is engaged with an engaging section 58 of the connecting section 51. In the connecting section 51, there is also formed an attaching piece 51A such that an attaching screw 57 is screwed, through the upper surface of the cover 54, on the screw hole of the attaching piece 51A. When the screw 57 is engaged, the cover 54 is fixed onto the connecting section 51; moreover, the elastic body 55 is depressed and hence the end portions of the optical fibers 57A and 57B are fixed.

On both sides of the lower portion of the connecting section, there is formed a groove 59 to be slidably engaged with the flanges 10a formed in the mounting section 11 of the apparatus body 10.

The sensing section 61 is constituted by collecting the top end portions of the optical fibers 57A and 57B.

Figure 7:
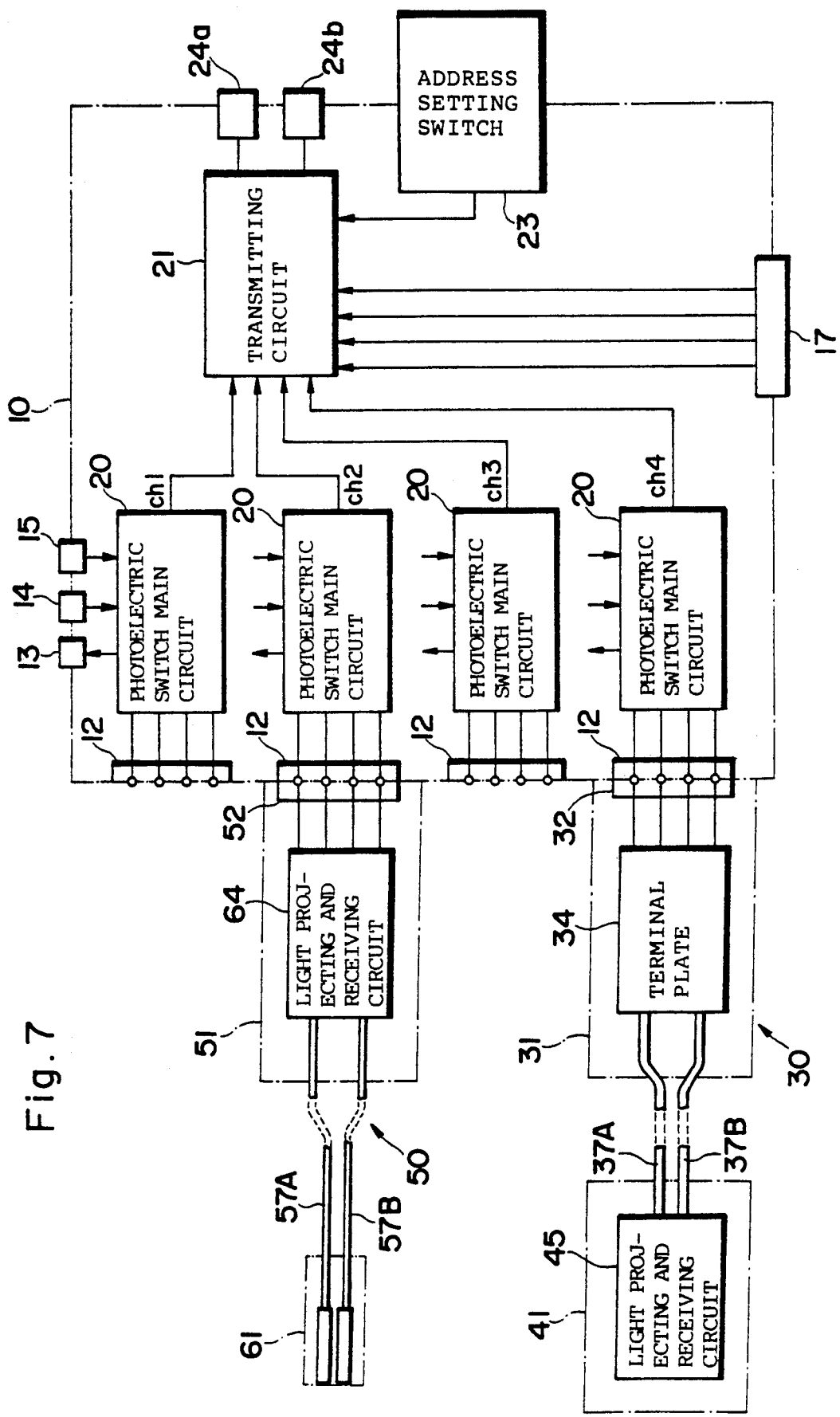
FIG. 7 is a block diagram showing the electric constitution of the multiple photoelectric switch apparatus.

Referring to FIG. 7, there is disposed in the apparatus body 10 a photoelectric switch main circuit 20 for each channel. These main circuits 20 are respectively connected to connectors 12 associated therewith. The main circuit 20 generates a light projection signal to supply the signal to the connector 12. Moreover, the main circuit 20 discriminates the level of a light reception signal inputted via the connector 12 according to an appropriate threshold level to output a switch signal.

The operation indication lamp 13, the sensitivity adjusting volume 14, and the on/off change-over switch 15 described above are connected to the main circuits 20 respectively associated therewith. The operation indication lamp 13 is controlled to be turned on or off by the switch signal outputted from the main circuit 20. The above threshold level is adjusted by the volume 14. The object sense level (H or L level) represented by the switch signal is set by the change-over switch 15 as described above.

The photoelectric switch main circuits 20 are also connected to a transmitting circuit 21. The switch signals outputted from the main circuit 20 are edited by the transmitting circuit 21 to be transmitted via the connector 24a or 24b to a control device, an upper-level control unit, or another apparatus body. An address set by the address specifying switch 23 is supplied to the transmitting circuit 21 to be employed as an address for a communication as described above.

The connector 17 is also connected to the transmitting circuit 21. A switch signal supplied from an apparatus body not having a transmitting circuit via the connector 17 is transmitted to an external device also by the transmitting circuit 21.

When the connecting section 31 of the photoelectric switch unit 30 of the first type is mounted on the mounting section 11, the connectors 12 and 32 are connected to each other. The sensing section 41 is arranged at a position where a detection object is to be sensed. A light projection signal generated from the main circuit 20 is supplied via the connectors 12 and 32, the connecting section 31, and the lead wire pair 37A to the light projecting and receiving circuit 45 of the sensing section 41 such that a projection light is produced from the light emitting diode 42. The projection light is reflected, when there exists a detection object, by the object so as to be received by the phototransistor 43. A light reception signal from the phototransistor 43 is amplified by the amplifier of the light projecting and receiving circuit 45 to be inputted via the lead wire pair 37B, the connecting section 31, and the connectors 32 and 12 to the photoelectric switch main circuit 20. The photoelectric switch main circuit 20 compares the level of the light reception signal with a threshold level to output to the transmitting circuit 21 a switch signal for the on or off (H or L level) (to be set by the on/off change-over switch 15). The transmitting circuit 21 transmits the signal to an external device. The operation of the photoelectric switch of the amplifier separation type is achieved in this manner.

When the connecting section 51 of the photoelectric switch unit 50 of the second type is mounted on the mounting section 11, the connectors 12 and 52 are connected to each other. The sensing section 61 is arranged at a position where a detection object is to be sensed. The light emitting diode 62 of the connecting section 64 is driven by a light projection signal which is generated from the main circuit 20 and which is supplied via the connectors 12 and 52. The projection light from the light emitting diode 62 is passed via the optical fiber 57A to the sensing section 61 to be projected from the top end portion of the optical fiber 57A onto an object. The light reflected by the object enters the optical fiber 57B from the top end portion thereof to be received by the phototransistor 63. A light reception signal from the phototransistor 63 is amplified by the amplifier of the light projecting and receiving circuit 64 and then is inputted via the connectors 52 and 12 to the photoelectric switch main circuit 20. The operation of the main circuit 20 is as described above. The photoelectric switch of the optical fiber type conducts operations in this manner.

In the multiple photoelectric switch apparatus, the photoelectric switch unit 30 of the first type and the photoelectric switch unit 50 of the second type can be arbitrarily and selectively mounted on the mounting sections 11 such that depending on the states and environments, the respective channels 1 to 4 (ch1 to ch4) can be set to any one of the amplifier separation type and the optical fiber type.

In the embodiment above, although the sensing sections 41 and 61 are of the reflection type, it is naturally be possible to use sensing sections of the transmissive type, namely, in a constitution in which the light projecting element and receiving element (or the top end portions of the optical fibers) oppose to each other.

Industrial Applicability

The multiple photoelectric switch apparatus is suitably applied to a control of various devices, collection of information, and the like based on an object sensing operation.

I claim:

1. A multiple photoelectric switch apparatus to which a first photoelectric switch unit comprising a first sensing head including a light projecting and receiving circuit having a light projecting element and a light receiving element and a first connecting section being connected to said first sensing head by a lead wire and including a unit-side first connector, and a second photoelectric switch unit comprising a second sensing head including end portions of optical fibers and a second connecting section being connected to said second sensing head by said optical fibers and including a light projecting and receiving circuit having a light projecting element and a light receiving element which are optically coupled with another ends of said optical fibers and a unit-side second connector, are applicable, comprising:

a plurality of unit mounting sections in which said first and second photoelectric switch units are selectively and detachably mounted;

a body-side connector which is disposed in each said unit mounting section and which is capable of being coupled with said unit-side first or second connector of said first or second photoelectric switch unit mounted on said each unit mounting section; and a plurality of signal processing circuits which are respectively connected to said body-side connectors and which are commonly applicable to said light projecting and receiving circuits of said first and second switch units.

2. A multiple photoelectric switch apparatus in accordance with claim 1 including a transmitting circuit for transmitting switch signals outputted from said plural signal processing circuits.

3. A multiple photoelectric switch apparatus in accordance with claim 2 including a connector for leading a switch signal from another multiple photoelectric switch apparatus to said transmitting circuit.

4. A multiple photoelectric switch apparatus in accordance with claim 2 including number specifying means for setting an identification number to be used when said transmitting circuit communicates with a control unit, an upper-level control device, or another multiple photoelectric switch apparatus.

5. A multiple photoelectric switch apparatus in accordance with claim 1 including means for fixing said first or second photoelectric switch unit mounted on said unit mounting section.

* * * * *